United States Patent
Wark et al.

[11] Patent Number: 5,911,329
[45] Date of Patent: Jun. 15, 1999

[54] APPARATUS AND METHOD FOR FACILITATING CIRCUIT BOARD PROCESSING

[75] Inventors: James M. Wark; Michael J. Bettinger, both of Boise, Id.

[73] Assignee: Micron Technology, Inc., Boise, Id.

[21] Appl. No.: 08/640,147

[22] Filed: Apr. 30, 1996

[51] Int. Cl.⁶ .................................................. A47G 19/08
[52] U.S. Cl. ........................ 211/41.17; 269/47; 269/69; 269/305; 269/903; 361/752
[58] Field of Search .................. 211/41.17; 361/784, 361/736, 752; 269/903, 47, 305, 69

[56] References Cited

U.S. PATENT DOCUMENTS

| | | | |
|---|---|---|---|
| 1,750,369 | 3/1930 | Septer | 269/305 |
| 3,614,540 | 10/1971 | Slusser | 211/41.17 X |
| 3,631,299 | 12/1971 | Meyer | 361/752 |
| 3,915,307 | 10/1975 | Agarde . | |
| 3,930,644 | 1/1976 | Albert, Jr. . | |
| 4,109,379 | 8/1978 | Ratti et al. . | |
| 4,155,447 | 5/1979 | Edwards . | |
| 4,198,024 | 4/1980 | Cavanna . | |
| 4,217,624 | 8/1980 | Tuck | 361/752 X |
| 4,291,867 | 9/1981 | Williams et al. . | |
| 4,385,781 | 5/1983 | Welsch et al. . | |
| 4,498,120 | 2/1985 | Kaufman | 361/784 X |
| 4,554,404 | 11/1985 | Gilder, Jr. et al. . | |
| 4,554,613 | 11/1985 | Kaufman | 361/784 X |
| 4,600,231 | 7/1986 | Sickles . | |
| 4,763,782 | 8/1988 | Sinchok . | |
| 4,805,316 | 2/1989 | Curti | 269/903 X |
| 4,908,738 | 3/1990 | Kobari et al. | 361/784 X |
| 4,910,866 | 3/1990 | Allen . | |
| 4,948,108 | 8/1990 | Sullivan | 269/305 X |
| 4,953,061 | 8/1990 | Nitkiewicz . | |
| 5,016,139 | 5/1991 | Stopa et al. | 361/736 X |
| 5,031,074 | 7/1991 | Ravid | 211/41.17 X |
| 5,044,615 | 9/1991 | Newman et al. . | |
| 5,111,935 | 5/1992 | Bond et al. . | |
| 5,148,962 | 9/1992 | Jones et al. | 361/784 X |
| 5,157,590 | 10/1992 | Barthel et al. | 361/752 X |
| 5,208,734 | 5/1993 | Someno | 361/736 X |
| 5,339,221 | 8/1994 | Conroy-Wass et al. . | |
| 5,375,040 | 12/1994 | Cooper et al. | 361/752 X |
| 5,406,454 | 4/1995 | Dinger et al. | 361/752 |
| 5,406,455 | 4/1995 | Devenish, III . | |
| 5,456,402 | 10/1995 | Curtin . | |
| 5,501,436 | 3/1996 | Miller | 269/903 X |
| 5,563,772 | 10/1996 | Nichols | 361/752 |

FOREIGN PATENT DOCUMENTS 57-8050  1/1982  Japan ........................... 269/69

Primary Examiner—Donald P. Walsh
Assistant Examiner—Emmanuel M. Marcelo
Attorney, Agent, or Firm—Trask, Britt & Rossa

[57] ABSTRACT

A circuit board carrier and method of using the same. The carrier allows circuit boards to be processed on lead frame-based semiconductor processing equipment. The circuit board carrier contains a structure to secure a circuit board thereto and the carrier is sized and shaped, and provided with standardized indexing holes, to allow processing of circuit boards on processing equipment configured for lead frame-based processing.

19 Claims, 7 Drawing Sheets

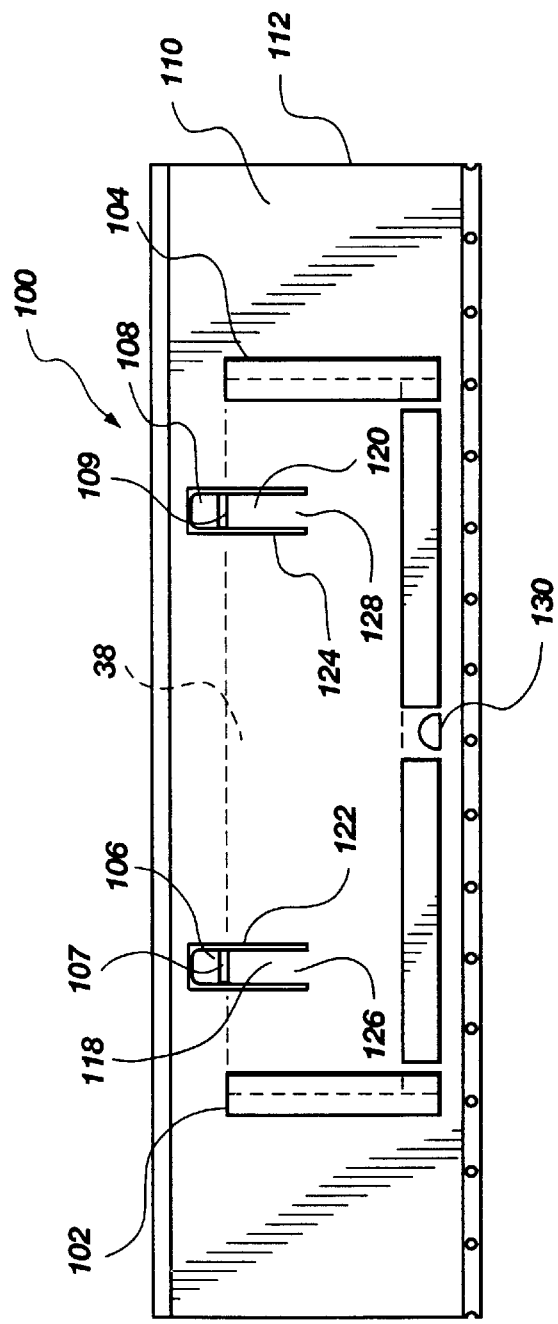
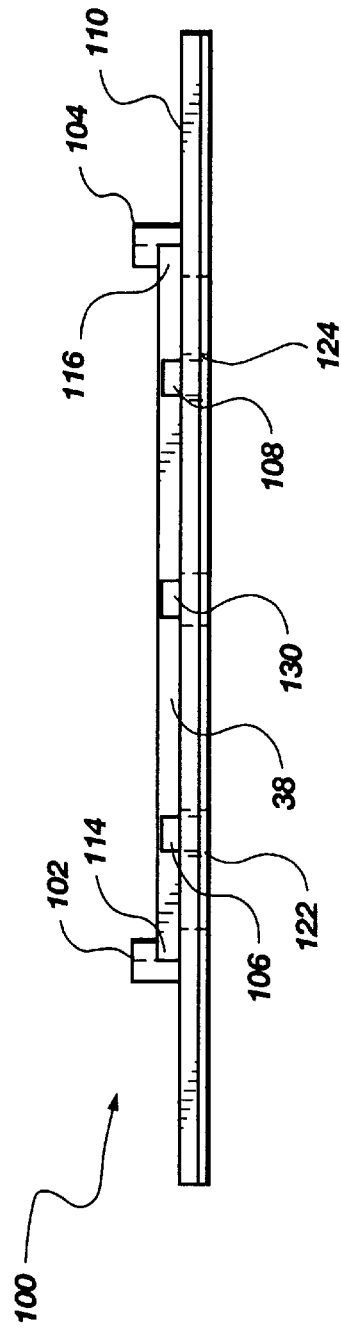
Fig. 4A
Fig. 4B

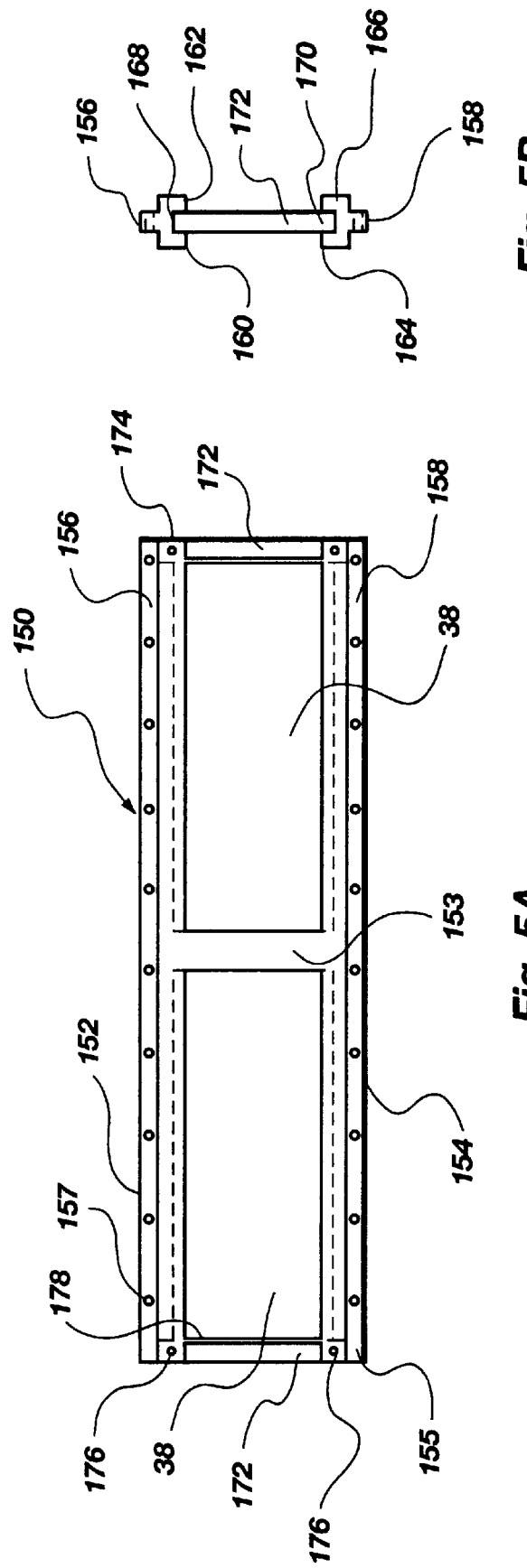

APPARATUS AND METHOD FOR FACILITATING CIRCUIT BOARD PROCESSING

BACKGROUND OF THE INVENTION

1. Field of the Invention

This invention relates generally to an apparatus and method for facilitating circuit board processing, and more specifically to a reusable circuit board carrier and method of using same that allows circuit boards to be processed on conventional semiconductor device assembly equipment commonly employed with lead frames.

2. State of the Art

The manufacture of packaged semiconductor devices is a most competitive, high volume industry. Because of its voluminous production nature, even minute improvements in manufacturing efficiency and/or quality can make a considerable difference in overall manufacturing costs, when accumulated over hundreds of thousands or even millions of units. Thus, automation of every manufacturing process is essential for one in the industry to compete, and improving those automated processes to make them more efficient and produce fewer defects is necessary to stay competitive.

Automation requires large capital expenditures in automated manufacturing and processing equipment. Moreover, such automated equipment is typically configured to process a specific component or component type having a particular standardized configuration, usually to the exclusion of other types of components. For example, dedicated equipment is purchased for fabrication of packaged semiconductor devices wherein a semiconductor die is mounted to a lead frame, wire-bonded thereto, encapsulated by transfer molding and then trimmed and formed to remove mold flashing and extraneous lead frame strip elements and form the external ends of the lead frame leads. Adaptability of at least some of such equipment, however, to accommodate another type of assembly, such as a printed circuit board assembly, would increase the value of the capital investment by providing greater opportunity for use and manufacturing flexibility.

One way to increase efficiency in the manufacturing of semiconductor devices is to process the devices in batches. Batch processing allows a group of components to be indexed through a given process station in greater numbers compared to throughputting single components, and results in more efficient utilization of the processing equipment. Thus, processing equipment is typically configured to perform one or more operations on a number of devices in a single cycle, creating faster processing cycle times and a lower cost per unit.

In order to accommodate batch processing in the manufacturing of packaged semiconductor devices, it is known in the art to form several similar components together as a unit for processing. For example, lead frames are typically formed as a linear lead frame strip comprised of several lead frames joined together at their peripheries. Thus, all of the lead frames in a lead frame strip can be substantially simultaneously processed by addition of dice, subsequent wire bonding, and finally encapsulation to form several packaged semiconductor devices, which are separated in a final trim and form operation, as previously described.

Lead frame strips commonly employ relatively robust longitudinal rail segments along each edge to stiffen the strip and provide indexing holes for manipulation of the strip within and between processing stations. Lead frames may also be provided with a carrier that not only provides structural support for the lead frame strip during processing, but is adapted to be indexable and/or conveyable by the manufacturing equipment. For example, in U.S. Pat. No. 5,111,935, a universal lead frame carrier is disclosed to hold individual strips of lead frames together with their respective chips for bonding. The lead frame carrier can then be used to systematically move the lead frame from station to station during manufacture. U.S. Pat. No. 4,554,404 discloses another lead frame support. Magazines, such as disclosed in U.S. Pat. No. 4,910,886, may be employed to transport or store a large number of lead frame strips, with or without carriers.

Because of the advantages of batch processing and workpiece handling techniques employed in the manufacture of packaged semiconductor devices, and more particularly to the processing of lead frame-based devices, such processing would also be beneficial in the manufacture of devices using printed circuit boards or other conductive trace-carrying substrates to which semiconductor dice are mounted and electrically connected. Conventional equipment used in the processing of packaged semiconductor devices, however, is typically configured to accommodate lead frame strips and/or packaged semiconductor devices based upon lead frames and is, therefore, not employable in the manufacture of printed circuit board assemblies and the like. Such equipment used in the manufacture of lead frame-based semiconductor devices (e.g., die attachers, wire bonders, drop dispensers and various lead frame magazines) would, however, be useful for the processing of printed circuit boards and other planar die supports, such as ceramic substrates, if a means could be formed to do so. Moreover, utilization of assembly equipment for more than one type of product would significantly reduce capital expenditures necessary for semiconductor manufacturing of different types of assemblies.

Different approaches have been employed for handling printed circuit boards, as disclosed in U.S. Pat. Nos. 3,915,307; 3,930,644; 4,109,379; 4,155,447; 4,198,024; 4,291,867; 4,385,781; 4,600,231; 4,763,782; 4,953,061; 5,339,221; 5,406,455; and 5,456,402. However, the foregoing patents are largely directed toward storage or transport of boards, in most instances are directed toward boards of substantial size, such as mother boards, are intended for installation of boards in chassis or other higher-level packaging for operational purposes, or are not adaptable to automated handling on a high-volume basis.

U.S. Pat. No. 5,044,615 discloses a printed circuit board holder adapted to retain a plurality of boards with a cam-type mechanism interposed between boards located in laterally and longitudinally adjacent recesses in the holder. The holder is not suitable in size or configuration for use with lead frame assembly processing and transport equipment, and may not provide the close locational tolerances necessary for use of die-attach and wirebonding equipment.

Thus, it would be advantageous to provide a reusable circuit board carrier and method of using same that allows circuit boards to be processed on conventional lead frame-based semiconductor device assembly equipment.

SUMMARY OF THE INVENTION

According to the present invention, a reusable circuit board carrier and method of using same is provided to allow circuit boards to be processed on conventional lead frame-based semiconductor device assembly equipment. More specifically, the circuit board carrier provides structure for temporarily aligning and securing a circuit board thereto for handling, storage and processing and allows the circuit board to be removed and replaced by another circuit board after processing has been completed. Moreover, the circuit board carrier may accommodate one or more circuit boards simultaneously in the same manner that multiple lead frames are manipulated together as a lead frame strip.

In a preferred embodiment, the circuit board carrier is comprised of an elongate, substantially planar member having a relatively thin cross-section and a generally rectangular perimeter. The circuit board carrier includes one or more board abutment surfaces for aligning at least one circuit board relative to the carrier, as well as structure for immobilizing and holding the aligned circuit board relative to the carrier. The abutment surfaces may include protrusions extending from the attachment surface of the circuit board carrier, the protrusions having various configurations for abutting flat or contoured edge surfaces of the circuit board. In addition, the immobilizing structure may include protrusions that extend from the attachment surface over a portion of the attached circuit board, or capture pins that fit through apertures in the circuit board and the attachment surface to pin the board to the carrier. Biased abutment surfaces that retract to allow insertion of a circuit board onto the carrier and then return to their original position once the circuit board is inserted may also be incorporated.

The carrier of the invention is sized and shaped to be transported between and processed on conventional semiconductor device assembly equipment and may include longitudinally extending lateral flanges along its outer edges. In addition, one or both of these flanges may include indexing holes formed therein to be engaged by transport and indexing devices. The carrier may also include an isolation member comprised of a relatively thin, substantially rectangular sheet of material, such as a static dissipative material or other suitable material known in the art, to isolate the circuit board from the carrier.

In another preferred embodiment, the circuit board carrier is comprised of two substantially parallel, elongate rails, each having grooves formed therein for holding one or more circuit boards. The circuit board carrier is provided with structure to keep the circuit board or boards from sliding out of the grooves, such as a transverse member having an interference fit with the grooves or otherwise secured to the rails (pin, screw, snap-fit, etc.) or a pivotally mounted member securable at its free end to the opposite rail. The circuit board carrier is sized and shaped to present circuit boards to be processed on conventional lead frame-based semiconductor device assembly equipment and may include indexing holes along the outer edge of one or both elongate rails to accommodate typical indexing equipment. The circuit board carrier includes at least one cross member for connecting the two rails together, which may be positioned at an end of the rails to accommodate one or more circuit boards slid into the carrier, or proximate a medial portion of the rails so that one or more circuit boards may be carried on either side of the cross-member.

As used in the description of the present invention and specifically in the claims appended hereto, the term "circuit board" is not limited to particular structures such as conventional FR4 boards, but encompasses any conductor-carrying, substantially planar substrate or other die support member formed of any suitable material, including without limitation conductor-carrying laminates formed of various materials, silicon or glass substrates with deposited (as by photolithography) conductors, ceramics substrates and other suitable conductor carriers as known in the art. Further, the term circuit board includes and encompasses all types of single- and multi-die assemblies, such as multi-chip modules (MCM's) including different types of die or the same die type, the latter being exemplified by single in-line memory modules (SIMM's) or dual in-line memory modules (DIMM's).

Although the circuit board carrier of the present invention has been described in relation to several preferred embodiments, it is believed that a major aspect of the invention is that the circuit board carrier allows circuit boards to be processed on conventional lead frame-based semiconductor device assembly equipment. This and other features of the present invention will become apparent from the following detailed description, the accompanying drawings, and the appended claims.

BRIEF DESCRIPTION OF THE DRAWINGS

FIGS. 4A and 4B are top and side schematic views, respectively, of a second embodiment of a circuit board carrier in accordance with the present invention;

FIGS. 5A and 5B are top and side schematic views, respectively, of a third embodiment of a circuit board carrier in accordance with the present invention;

DETAILED DESCRIPTION OF THE ILLUSTRATED EMBODIMENT

Figure 1:
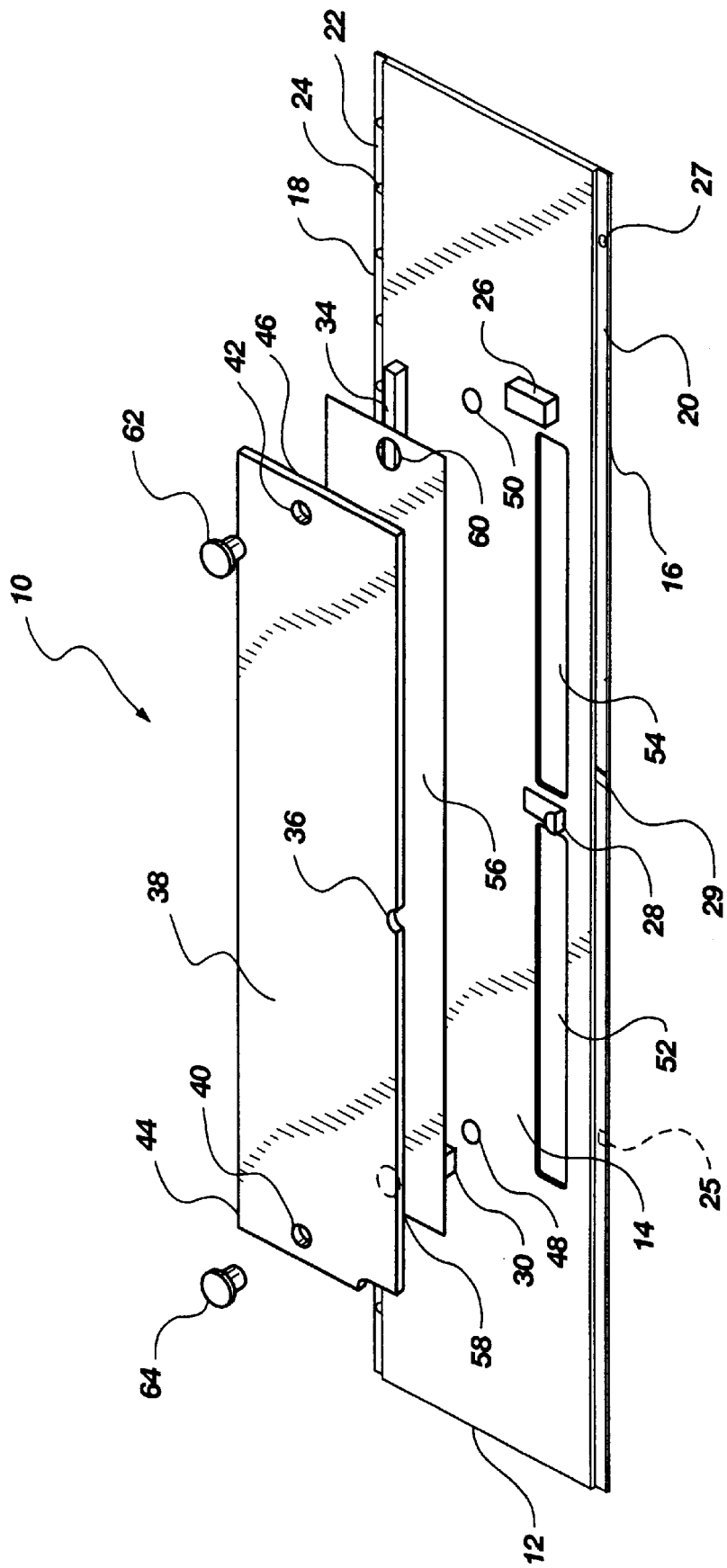
FIG. 1 is an exploded, perspective view of a first embodiment of a circuit board carrier in accordance with the present invention.

FIG. 1 shows a circuit board carrier 10 in an exploded perspective view, carrier 10 being generally comprised of an elongate, substantially planar member 12 defining an attachment surface 14. The planar member 12 has a generally rectangular configuration and is sized to be indexed through conventional lead frame-based semiconductor device assembly equipment, as known in the art. Extending longitudinally along the outer edges 16 and 18 of the planar member 12 are two substantially parallel flanges 20 and 22, respectively. One or both of the flanges 20 and 22 may be provided with a plurality of indexing or tooling holes 24. Such tooling holes 24 are used in the art for workpiece transport purposes and to position components within an assembly apparatus. It is preferred that flanges 20 and 22 be formed of a rigid, dimensionally-stable material such as spring steel, for example of 0.010" thickness. This is due to the fact that commonly-employed circuit board materials such as FR4 are neither dimensionally stable nor robust enough to accommodate transport and indexing equipment without alignment problems and potential damage to the unit. Moreover, the separately-formed flanges are easily replaceable if worn or damaged, so that an entire carrier need not be scrapped. The flanges may be mechanically or adhesively secured to the main body of the carrier 10, as in laterally-extending grooves cut or otherwise formed in the sides of member 12. Further, the flanges 20 and 22 might be provided with board position indicators such as notches 25 (broken lines), holes 27 of different shape than indexing or tooling holes 24, or segments 29 of a different material detectable by a proximity sensor so that the presence and exact location of a particular board (especially useful on a multi-board carrier) is easily determinable by the wire bonder, die-attach equipment, or other processing apparatus.

Carrier 10 may be of any suitable length to carry more than one circuit board, the ultimate length thereof being dictated by the longest lead frame strip the storage, transport and processing equipment employed with the carrier is designed to accommodate (generally under ten (10) inches or 25.40 cm.). Similarly, width of carrier 10 is also dictated by existing equipment, and is generally, therefore, under two (2) inches (5.08 cm.), the same as a large lead frame strip.

The planar member 12 includes a plurality of board abutment protrusions 26, 28, 30, 32, and 34 extending from the attachment surface 14 having a generally rectangular configuration, such as protrusions 26, 30, 32 (see FIG. 3), and 34, or a contoured cross-section, such as protrusion 28, to fit a like-contoured edge 36 of a circuit board 38. The side abutment surfaces of protrusions 26, 28, 30, 32, and 34 are used to align and maintain the circuit board 38 in exact or precise position relative to the planar member 12.

An exemplary circuit board 38 as schematically shown includes two apertures 40 and 42 proximate its respective ends 44 and 46. The planar member 12 also includes apertures 48 and 50 sized, shaped and positioned to be in substantial alignment with the apertures 40 and 42 of the circuit board 38 when the circuit board 38 is properly positioned on the attachment surface 14. The planar member 12 may also include openings 52 and 54 for access to the underside of the circuit board 38.

An isolation member 56 of a dielectric, preferably static-dissipative material as known in the art, sized and shaped to fit between the circuit board 38 and the planar member 12 may also be included in conjunction with the carrier 10 to isolate the circuit board 38 from the planar member 12. The isolation member 56 also includes apertures 58 and 60 positioned to align with apertures 40 and 42.

To assemble the carrier 10 with an attached circuit board 38, the isolation member 56 is placed on the attachment surface 14 followed by the circuit board 38 such that the isolation member 56 and the circuit board 38 abut the protrusions 26, 28, 30, 32, and 34. As such, the apertures 42, 60 and 50 should be in alignment, as should apertures 40, 58, and 48. Capture pin 62 is then inserted into apertures 42, 60 and 50 and capture pin 64 inserted into apertures 40, 58, and 48 to hold the circuit board 38, isolation member 56 and planar member 12 together.

Figure 2:
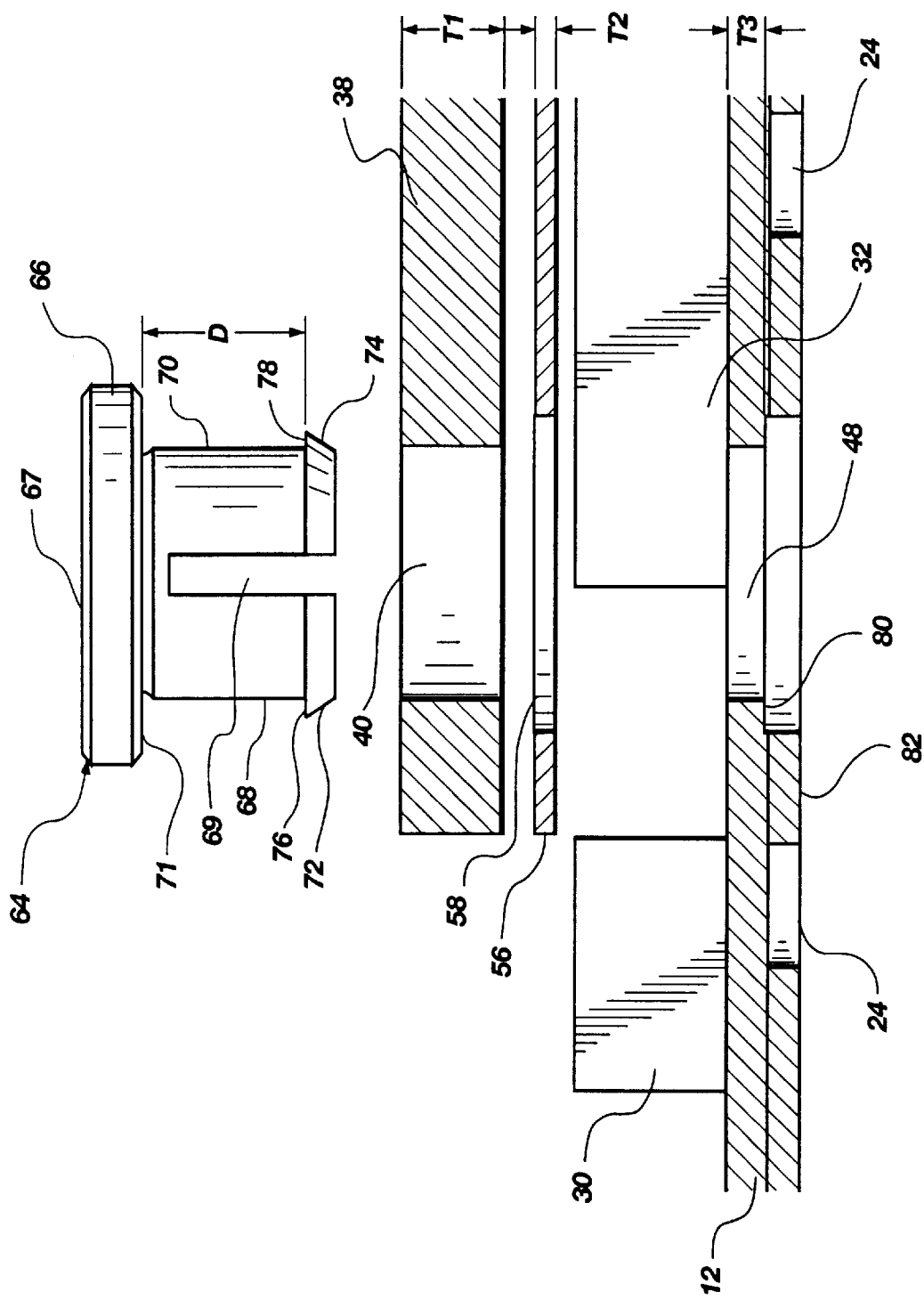
FIG. 2 is a close-up exploded schematic view of a capture pin and associated circuit board carrier of the embodiment of FIG. 1.

As better shown in FIG. 2, the capture pin 64 (which is substantially the same as capture pin 62) includes a cap portion 66 at its proximal end 67, a first substantially semi-cylindrical member 68, and a second substantially semi-cylindrical member 70 extending from the bottom surface 71 of the cap portion 66. Members 68 and 70 are separated by a diametrically-extending compression gap 69. Half-frustoconical protrusions 72 and 74 at the distal end of the capture pin 64 extend from the semi-cylindrical members 68 and 70, respectively, but have a slightly larger diameter to provide retaining upper edges 76 and 78, respectively, for abutting downwardly-facing annular shoulder 80 in the countersunk base of aperture 48. The first and second substantially semi-cylindrical members 68 and 70 extend a distance D equal to the combined thickness T1 of the circuit board 38, plus the thickness T2 of the isolation member 56, plus the thickness T3 of the portion of the planar member 12 grasped by the frustoconical protrusions 72 and 74. Thus, when the carrier 10 is assembled, entry of the half-frustoconical protrusions 72 and 74 into aperture 48 squeezes the substantially semi-cylindrical members 68 and 70 together to close compression gap 69 until the protrusions 72 and 74 extend into the counterbore of aperture 48 and upper edges 76 and 78 engage the shoulder 80. The protrusions 72 and 74 fit wholly within the aperture 48 and do not extend below the bottom surface 82 of the planar member 12.

Figure 3:
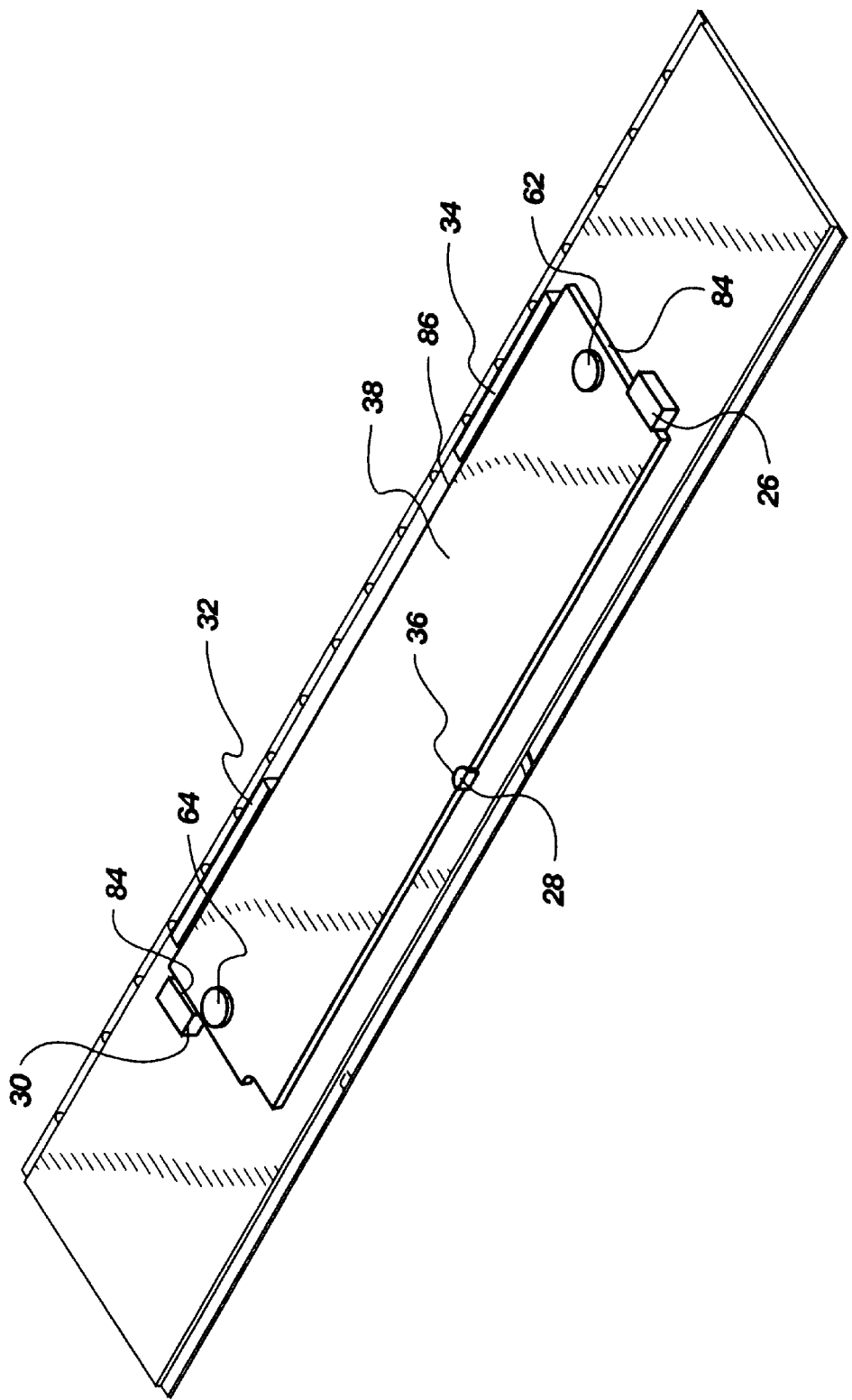
FIG. 3 is a perspective view of the embodiment of the circuit board carrier of FIG. 1 in assembled form.

FIG. 3 shows the circuit board carrier 10 in assembled form with circuit board 38 in place. As illustrated, the one end 84 of the circuit board 38 abuts the carrier protrusion 26, the contoured edge 36 is abutted by the carrier protrusion 28, the other end 84 is abutted by carrier protrusion 30, and the side 86 is abutted by protrusions 32 and 34. Moreover, the circuit board 38 is securely attached to the planar member 12 by capture pins 62 and 64, permitting partial or complete inversion of the assembly as desired or required for transport, storage or processing.

The circuit board carrier 100 illustrated in FIGS. 4A and 4B is similar to the previously described embodiment, except that a circuit board, such as circuit board 38, may be held in position by inverted L-shaped protrusions 102 and 104 and biased protrusions 106 and 108. The inverted L-shaped protrusions 102 and 104 extend transversely across the top surface 110 of the elongate, substantially planar member 112 to laterally position a circuit board 38 on the planar member 112 within the grooves 114 and 116 formed between the L-shaped protrusions 102 and 104 and the top surface 110. The biased protrusions 106 and 108 extend upwardly from the top surface 110 and are biased by leaf-type biasing members 118 and 120. The biasing members 118 and 120 are positioned in cut-outs 122 and 124 and attached at their proximal ends 126 and 128 in a cantilevered fashion to the planar member 112. As shown, biasing members 118 and 120 may be formed integrally with planar member 112, and of a reduced thickness in comparison thereto on one or both sides of member 112 to enhance resiliency. Thus, to secure a circuit board to the circuit board carrier 100, the protrusions 106 and 108 are depressed to allow lateral passage of the board 38. The circuit board 38 is then slid into the grooves 114 and 116 until contacted by the protrusion 130 and protrusions 106 and 108 are then allowed to return to their original positions. As with the previously discussed embodiment, the circuit board carrier 100 has the ability to be used for processing circuit boards in conventional lead frame-based semiconductor device assembly equipment. It is also possible to use straight-sided protrusions at the locations of protrusions 102 and 104 (see broken lines in FIG. 4B) and to hold a board 38 against the vertical surfaces of the fixed protrusions with biased protrusions 106 and 108. Moreover, rather than using leaf-type biasing members such as 118 and 120, protrusions such as 106 and 108 might be provided with elastomeric or other (such as coil or bow-spring) biasing elements 107 and 109 on their inner faces, so that a board may be dropped between the (straight-sided) protrusions, pushed laterally against biasing elements 107 and 109, and released, biasing elements 107 and 109 then resiliently aligning board 38 against protrusion 130 and between protrusions at the locations of 102 and 104.

Referring now to FIGS. 5A and 5B, another preferred embodiment of a circuit board carrier 150 is illustrated. The carrier 150 is generally comprised of two longitudinally extending, substantially parallel elongate rails 152 and 154. The rails 152 and 154 are held in relative position to one another by a cross-member 153 secured proximate the midpoints of the rails 152 and 154. As illustrated, the carrier 150 is designed to hold two circuit boards 38. Those skilled in the art, however, will recognize that it may be possible to accommodate a single board 38 by moving the cross-member 153 to one end 155 and shortening the lengths of the rails 152 and 154. Moreover, having rails 152 and 154 as illustrated with the cross-member positioned at one end 155 would allow two circuit boards 38 to be held by the carrier in a mutually abutted relationship.

As better seen in FIG. 5B, each of the rails 152 and 154 has a Y-shaped cross-section including longitudinally extending flanges 156 and 158 forming the tail or base of the Y-shape and extensions 160, 162 and 164, 166 defining longitudinally extending grooves 168 and 170, respectively. The grooves 168 and 170 are sized and shaped to receive a circuit board 38 that may be slid therein until abutted by the cross-member 153. The grooves 168 and 170 hold the circuit board 38 from all movement, other than longitudinal, relative to the carrier 150. The flanges 156 and 158 may include a plurality of indexing holes 157 to accommodate processing on conventional semiconductor assembly equipment.

In order to keep the circuit boards 38 within the carrier 150 without becoming dislodged from the rails 152 and 154, a retaining member 172 may be secured to the ends 155 and 174 of the rails 152 and 154. Something as simple as a substantially rectangular bar 172 forming an interference fit between the grooves 168 and 170 at their ends 155 and 174 may be used to hold circuit boards 38 against longitudinal movement relative to the carrier 150. Thus, to secure the circuit boards 38 within the carrier 150, one board 38 is slid into one end 155 of the grooves 168 and 170 to abut cross-member 153 on one side thereof, and another board 38 is slid into the other end 174 of the grooves 168 and 170 to abut cross-member 153 on the other side thereof. A retaining member 172 is pressed into each end 155 and 174 of the carrier 150 and the boards 38 may then be processed through conventional semiconductor assembly equipment. Boards 38 are held in exact longitudinal and lateral alignment for processing, longitudinally through their abutment with cross-member 153, and laterally by the constraining rails 152 and 154. It is contemplated that retaining members may be mechanically secured to rails 152 and 154 at 176 by screws, pins or preferably a snap-lock type mechanism using resilient elements for tool-free insertion and removal. Further, the interior (facing cross-member 153) edges of retaining members 172 may carry an elastomer strip, a leaf spring, or other biasing element 178 to longitudinally, resiliently maintain boards 38 against cross-member 153.

Figure 6:
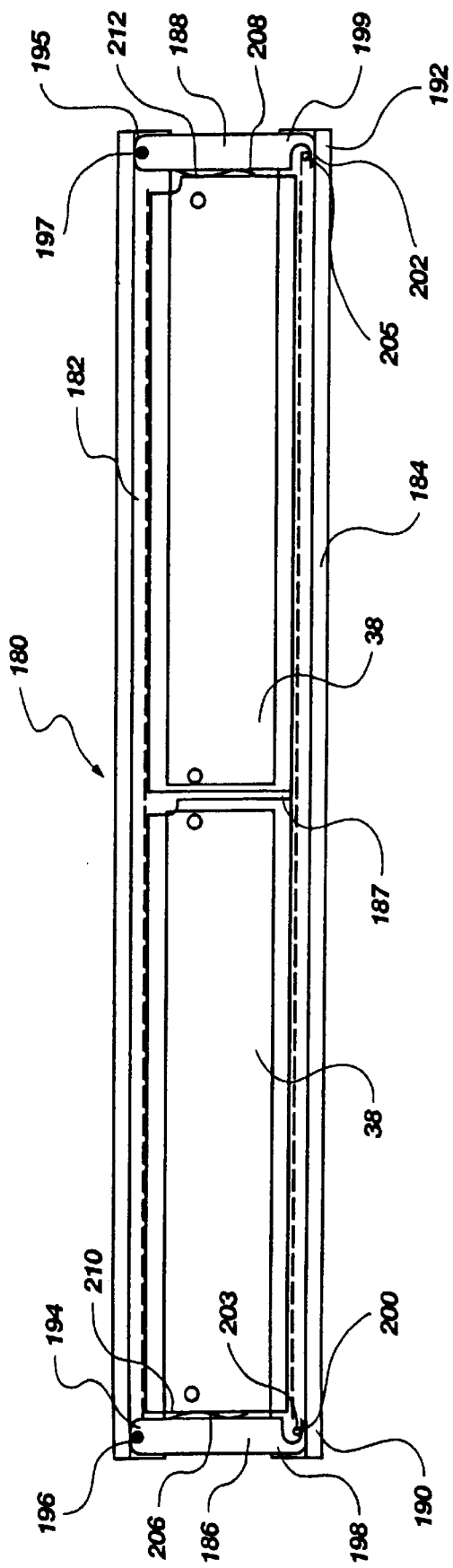
FIG. 6 is a top schematic view of a fourth embodiment of a circuit board carrier in accordance with the present invention.

The carrier 180 illustrated in FIG. 6 is substantially similar to the carrier 150 of FIGS. 5A and 5B including Y-shaped elongate rails 182 and 184 and cross-member 186. The carrier 180, however, includes pivotally mounted, elongate retaining members 186 and 188 at the carrier's ends 190 and 192, respectively. The retaining members 186 and 188 are pivotally mounted to rotate in the plane of the carrier at their first ends 194 and 195, respectively, to the rail 182 by cylindrical pins or protrusions 196 and 197 or other means known in the art. The second ends 198 and 199 of the retaining members 186 and 188 define hooked portions 200 and 202, respectively. Locking protrusions or pegs 203 and 205 are attached proximate the proximal and distal ends 190 and 192 of the rail 184 to engage with and hold the hooked portions 200 and 202 relative to the rail 184 upon inward rotation of the retaining members 186 and 188, respectively.

As the retaining members 186 and 188 are rotated to secure the circuit boards 38, biasing members 206 and 208, such as leaf-type springs attached to the retaining members 186 and 188, respectively, are pressed against the ends 210 and 212 of the boards 38 to force the boards 38 toward the cross-member 187. The engagement of the hooked portions 200 and 202 with the pegs 203 and 205 sufficiently secures the retaining members 186 and 188 to the rail 184 to withstand the force of the biasing members 206 and 208.

Figure 7:
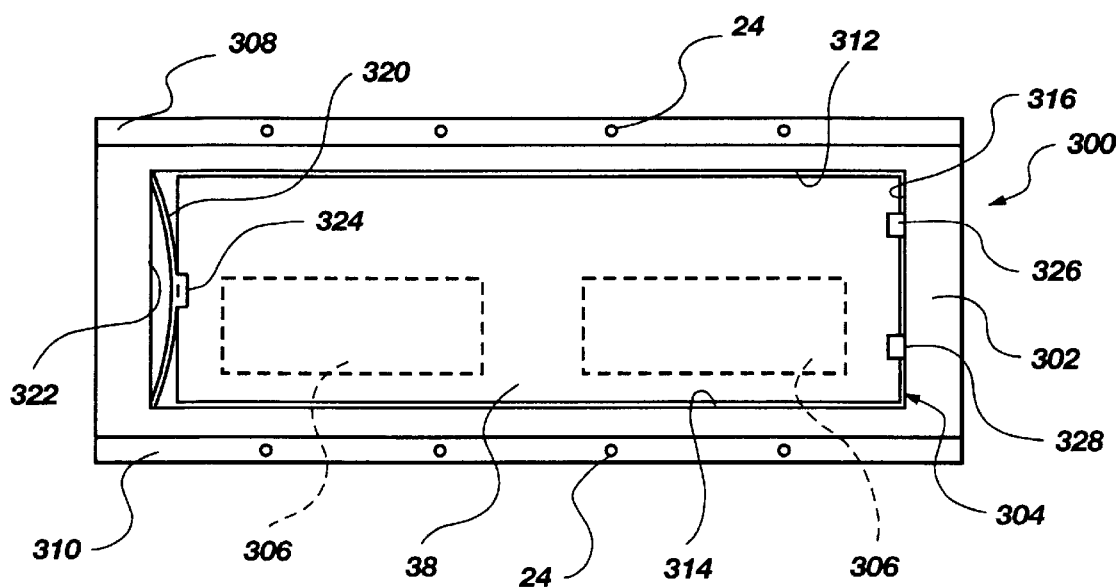
FIG. 7 is a top schematic view of a fifth embodiment of a circuit board carrier in accordance with the present invention.

FIG. 7 depicts another alternative carrier 300 comprised of a substantially planar member 302 having a recess 304 in the upper surface thereof, and optional underside recesses 306 to provide access to the back of a board 38 disposed in upper recess 304. Member 302 includes lateral side rails 308 and 310 extending co-planarly therefrom, side rails 308 and 310 including indexing holes 24 as previously discussed. Inner lateral surfaces 312 and 314, and inner end surface 316, of recess 304, provide alignment surfaces for board 38, while bow spring 320 abutting inner end surface 322 ensures longitudinal abutment of board 38 against inner end surface 316. Retainer clip 324 further ensures board security during inversion, and may be augmented by retention tabs 326 and 328, if desired, extending over board 38 above surface 316. Other arrangements might be employed, such as a resilient elastomer strip placed along an end surface such as end surface 322 inside recess 304 in combination with deflectable plastic retention tabs or even strips extending over parts of the periphery of recess 304. Resilient straps such as elastomeric bands may also be placed to extend over portions of the board to which dice are not to be mounted, pulled out of the way during board insertion, and released to retain board 38.

It will be further understood and appreciated by those skilled in the art that the present invention, in addition to permitting use of lead frame handling and processing equipment for circuit boards, also affords advantages in board yield. Specifically, boards are formed in groups on large dielectric panels, such as of FR4. In boards which are to be handled and processed using the carriers of the invention, no boundaries or other areas on the panel are required, as the boards are singulated and placed in the carriers. Thus, waste or "thiefage" of panel material is virtually eliminated. Moreover, with certain designs of the inventive carrier wherein substantially the full face of each board is exposed (no borders being required for holding or handling), more board "real estate" is available for location of components, circuit traces, and connectors.

In the exemplary embodiments, the circuit board carrier as illustrated has an elongated, generally rectangular configuration holding one or two circuit boards. Those skilled in the art, however, will appreciate that the size, shape, number of circuit boards held and/or configuration of the carrier may vary to accommodate the type and/or configuration of assembly equipment through which the carrier is indexed, without departing from the scope of the present invention. Moreover, those skilled in the art will appreciate that there may be other means of attaching the circuit board to the carrier including modifications and combinations of the means described herein. It will also be appreciated by one of ordinary skill in the art that one or more features of the illustrated embodiments may be combined with one or more features from another to form yet another combination within the scope of the invention as described and claimed herein. Thus, while certain representative embodiments and details have been shown for purposes of illustrating the invention, it will be apparent to those skilled in the art that various changes in the invention disclosed herein may be made without departing from the scope of the invention, which is defined in the appended claims. For example, while the invention has been described with reference to certain processing equipment, such as wire bonders and die-attach machines, it will be appreciated that the invention may also be employed with die pick-and-place devices and inverters to effectuate flip-chip die placement on boards in the carriers of the invention. Furthermore, flex-circuits comprising conductive traces on a flexible dielectric sheet or film (also called TAB tape for Tape Automated Bonding) may be employed with the invention to electrically connect die to circuit boards disposed in the carriers.

What is claimed is:

1. An apparatus for supporting a circuit board, comprising:
    an elongate, substantially planar member having a circuit board attachment surface and having a flange located along at least a portion of a lateral edge of said elongate, substantially planar member, the flange extending from the planar member in a plane substantially parallel to the elongate, substantially planar member; and
    at least one circuit board attachment structure for locating said circuit board proximate said circuit board attachment surface.

2. The apparatus of claim 1, wherein said elongate, substantially planar member comprises at least one aperture.

3. The apparatus of claim 2, wherein said at least one circuit board attachment structure is at least one capture pin extending through said at least one aperture.

4. The apparatus of claim 3, further comprising at least two capture pins and at least two apertures defined in said elongate, substantially planar member.

5. The apparatus of claim 1, further comprising at least one abutment extending upwardly from and attached to said circuit board attachment surface and proximate an outer edge of said circuit board attachment surface.

6. The apparatus of claim 5, wherein said at least one abutment comprises a plurality of abutment surfaces positioned around at least a portion of said circuit board attachment surface.

7. The apparatus of claim 6, wherein at least one of said plurality of abutment surfaces comprises an alignment element for aligning said circuit board on said circuit board attachment surface.

8. The apparatus of claim 1, further including an isolation member disposed on said circuit board attachment surface.

9. The apparatus of claim 1, wherein said elongate, substantially planar member comprises another flange located along at least a portion of another lateral edge of said elongate, substantially planar member.

10. The apparatus of claim 9, wherein at least one of said flanges comprises at least one indexing hole.

11. A method of facilitating circuit board processing, comprising:
    providing a circuit board carrier having an elongate, substantially planar member having a circuit board attachment surface and having a flange located along at least a portion of a lateral edge of said elongate, substantially planar member, the flange extending from the planar member in a plane substantially parallel to the elongate, substantially planar member and having at least one indexing hole;
    removably securing at least one circuit board by at least one attachment structure to said circuit board attachment surface;
    transporting said removably secured at least one circuit board on said circuit board carrier by engaging said at least one indexing hole with an indexing device; and
    utilizing said circuit board carrier in processing said removably secured at least one circuit board.

12. The method of claim 11, further comprising removing said at least one circuit board after processing thereof and reusing said circuit board carrier for processing other circuit boards.

13. An apparatus for supporting at least one circuit board, comprising:
    an elongated board carrier member having first and second lateral edges and comprising a flange located along at least a portion of said first or second lateral edge of said elongated board carrier member, said flange extending from said elongated board carrier member in a plane substantially parallel to said elongated board carrier member and having at least one manipulation element on said flange; and
    at least one board retention element for retaining said at least one circuit board to said elongated board carrier member.

14. The apparatus of claim 13, wherein said at least one board retention element is adapted to immovably secure said at least one circuit board to said elongated board carrier member.

15. The apparatus of claim 13, wherein said at least one board retention element is adapted to resiliently secure said at least one circuit board to said elongated board carrier member.

16. The apparatus of claim 15, further comprising another board retention element for securing said at least one circuit board to said elongated board carrier member responsive to said resilient securing of said at least one board retention element.

17. The apparatus of claim 13, wherein said at least one board retention element comprises a plurality of board retention elements disposed proximate a board support surface on said elongated board carrier member.

18. The apparatus of claim 17, wherein said plurality of board retention elements comprises at least one element for lateral alignment of said at least one circuit board on said board support surface and at least one element for longitudinal alignment of said at least one circuit board on said board support surface.

19. The apparatus of claim 13, wherein the at least one manipulation element includes a longitudinally-spaced indexing aperture.

* * * * *

UNITED STATES PATENT AND TRADEMARK OFFICE
CERTIFICATE OF CORRECTION

PATENT NO : 5,911,329
DATED : June 15, 1999
INVENTOR(S) : Wark et al.

It is certified that error appears in the above-identified patent and that said Letters Patent is hereby corrected as shown below:

Column 5    line 1    change "member 12" to --planar member 12--.

Column 6    line 3    after "by the" change "frustoconical" to --half-frustoconical--.

Column 6    line 7    before "protrusions" insert --half-frustoconical--.

Column 6    line 9    before "protrusions" insert --half-frustoconical--.

Column 6    line 41    before "member" insert --planar--.

Column 6    line 43    before "protrusions" insert --biased--.

Column 6    line 46    before "protrusions" insert --biased--.

Column 6    line 52    before "protrusions" insert --L-shaped--.

Column 6    line 56    before "protrusions" insert --biased--.

Signed and Sealed this

Second Day of May, 2000

Q. TODD DICKINSON

*Attest:*

*Attesting Officer*      *Director of Patents and Trademarks*